United States Patent
Uda et al.

[11] Patent Number: 6,052,029
[45] Date of Patent: Apr. 18, 2000

[54] STABILIZING CIRCUIT AND AMPLIFIER

[75] Inventors: Hisanori Uda, Hirakata; Masao Nishida, Sakai, both of Japan

[73] Assignee: Sanyo Electric Co., Ltd., Osaka-fu, Japan

[21] Appl. No.: 09/103,728

[22] Filed: Jun. 23, 1998

[30] Foreign Application Priority Data

Jun. 25, 1997 [JP] Japan ..................... 9-169223

[51] Int. Cl.[7] .............. H03F 3/16; H03F 1/30; H03F 3/04
[52] U.S. Cl. .......... 330/277; 330/290; 330/302
[58] Field of Search .................. 330/277, 286, 330/302, 310, 290, 296

[56] References Cited

U.S. PATENT DOCUMENTS

| | | | |
|---|---|---|---|
| 4,107,621 | 8/1978 | Furutani et al. | 330/296 |
| 4,225,827 | 9/1980 | Davis, Jr. | 330/296 |
| 5,194,826 | 3/1993 | Huusko | 330/306 |
| 5,229,732 | 7/1993 | Furutani et al. | 330/277 |
| 5,548,248 | 8/1996 | Wang | 330/302 |
| 5,592,122 | 1/1997 | Marahiro et al. | 330/286 |
| 5,726,606 | 3/1998 | Marland | 330/302 |

OTHER PUBLICATIONS

Robert Soares, GaAs MESFET Circuit Design, pp. 79–88.

Max W. Medley, Microwave and RF Circuits; Analysis, Synthesis and Design, pp. 288–304.

F.J. Burkhard, Editor; R.P. Dolan, L.D. Shergalis, R.A. Erickson, Art Director, Hewlett–Parkard Journal, vol. 18, No. 6, pp. 33–34.

*Primary Examiner*—Robert Pascal
*Assistant Examiner*—Patricia Nguyen
*Attorney, Agent, or Firm*—Akin, Gump, Strauss, Hauer & Feld, L.L.P.

[57] ABSTRACT

A capacitor is connected between the gate of an FET and an input node, and a resistor is connected between the input node and a ground terminal, thereby preventing the FET from oscillating in a low-frequency domain. A capacitor is connected between the drain of the FET and a ground terminal, or a line and a capacitor are connected in series between the drain of the FET and a ground terminal, thereby preventing the FET from oscillating in a high-frequency domain or at a specific frequency in the high-frequency domain.

26 Claims, 10 Drawing Sheets

F I G. 7A
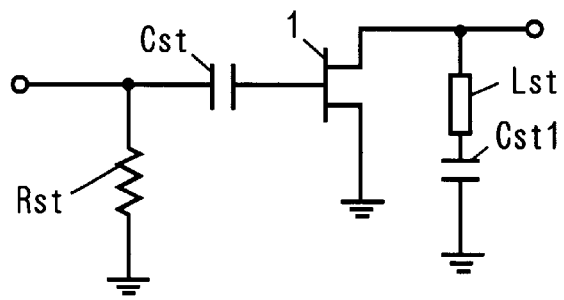
F I G. 7B
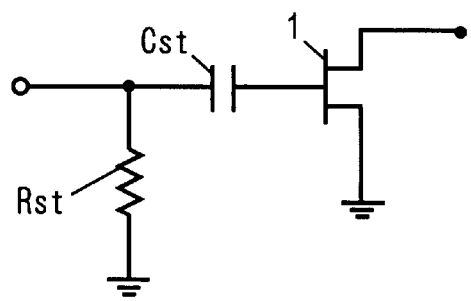
F I G. 7C
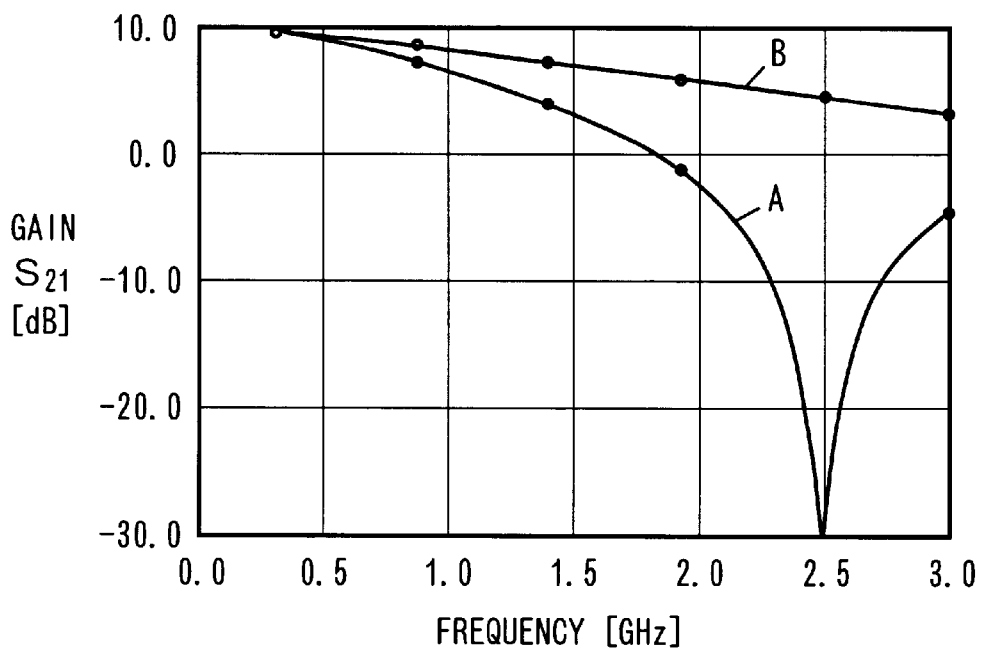

STABILIZING CIRCUIT AND AMPLIFIER

BACKGROUND OF THE INVENTION

1. Field of the Invention

The present invention relates to a stabilizing circuit for preventing a transistor from oscillating and an amplifier comprising the same.

2. Description of the Prior Art

In recent years, radio waves of an extremely large number of frequencies are required for communication following rapid development of mobile communication, and the frequencies of radio waves employed for mobile communication are now shifting to the microwave band. An amplifier which is applied to a portable machine for such mobile communication is provided with a stabilizing circuit for preventing a field-effect transistor (hereinafter referred to as an FET) from oscillating.

FIG. 13 is a circuit diagram showing an exemplary conventional stabilizing circuit. The stabilizing circuit shown in FIG. 13, which includes resistors R1, R2 and Ra and a capacitor Ca, serves also as gate bias means.

The resistors Ra and R1 are connected between the gate of an FET 100 and a ground terminal, and the resistor R2 is connected between the source of the FET 100 and a power supply terminal NG receiving a power supply voltage Vg. The node between the resistors Ra and R1 is connected to a ground terminal through the capacitor Ca. The resistors Ra, R1 and R2 form a gate bias circuit for applying a gate bias to the gate of the FET 100.

In the stabilizing circuit shown in FIG. 13, part of an input signal flows to the resistor Ra and the capacitor Ca. Thus, the resistor Ra causes circuit loss, to prevent the FET 100 from oscillating over all frequency domains.

FIG. 14 is a circuit diagram showing another exemplary conventional stabilizing circuit. The stabilizing circuit shown in FIG. 14 is formed by a feedback circuit provided with a capacitor Cf and a resistor Rf.

The resistor Rf and the capacitor Cf are connected in series between the drain and the gate of an FET 100. Resistors R1 and R2 form a gate bias circuit for applying a gate bias to the gate of the FET 100.

The stabilizing circuit feeds back an output signal which is outputted from the drain of the FET 100 to the gate in opposite phase. Thus, the FET 100 is prevented from oscillating in a high-frequency domain due to the negative feedback effect.

The stabilizing circuit shown in FIG. 13 prevents the FET 100 from oscillating by causing circuit loss. If the resistance value of the resistor Ra is larger than the impedance of the FET 100 in this case, a current hardly flows to the resistor Ra. Therefore, the resistance value of the resistor Ra must be reduced to some extent. Further, the capacitance value of the capacitor Ca must be relatively increased, for reducing its impedance.

In order to stabilize an FET having a large reflection coefficient (approximate to 1) and a high gain, for example, the resistance value of the resistor Ra must be reduced to not more than about 20 Ω, and the capacitance value of the capacitor Ca must be increased to about 100 pF. A large occupied area is required for preparing the resistor Ra having a small resistance value, while a large occupied area is also required for preparing the capacitor Ca having a large capacitance value. Consequently, the chip area is increased.

In the stabilizing circuit shown in FIG. 13, the K value (stability factor) can be increased beyond 1 over the frequency domain of 0 to several GHz. Absolute stability is attained if the K value is larger than 1. However, stabilization of the FET 100 is reciprocal to the gain. When stabilizing the FET 100 over a wide frequency domain in case of preparing an amplifier for amplifying signals of a specific frequency domain, therefore, the gain in the specific frequency domain is disadvantageously reduced. While the FET 100 has no possibility of oscillation if sufficiently stabilized, no sufficient gain is attained at a desired frequency in this case.

On the other hand, the stabilizing circuit shown in FIG. 14 can stabilize the FET 100 in a high-frequency domain, while stabilization of the FET 100 may not necessarily be attained in a low-frequency domain. An FET requires negative resistance for oscillation. In general, this negative resistance is readily generated on a low-frequency side in case of employing a common-source FET (refer to "the Basis of MMIC Oscillator Design" by Takashi Ohira, NWE Microwave Workshop Digest, 1996, pp. 438–447). Further, the common-source FET is generally instable with a small K value on a low-frequency side. In order to prevent the FET from oscillating, therefore, it is important to attain stabilization in the low-frequency domain. The stabilizing circuit shown in FIG. 14, which can not necessarily prevent the FET 100 from oscillating in the low-frequency domain, is incapable of sufficiently stabilizing the FET 100.

Further, application of the feedback circuit to a power amplifier or the like, which requires consideration of a nonlinear operation, may result in subharmonic oscillation (refer to "Microwave Nonlinear Circuit Technique" by Kazuhiko Honjo, NWE95 Microwave Workshop Digest, 1995, pp. 65–74). Thus, a countermeasure for suppressing the subharmonic oscillation is required.

SUMMARY OF THE INVENTION

An object of the present invention is to provide a stabilizing circuit having a small occupied area which can prevent a field-effect transistor from oscillating while suppressing reduction of the gain in a desired frequency domain and an amplifier comprising the same.

A stabilizing circuit according to an aspect of the present invention, which is adapted to stabilize a transistor, comprises a first capacitor which is connected between an input node receiving an input signal and an input-side electrode of the transistor, and a first resistor which is connected between the input node and a prescribed reference potential.

In this stabilizing circuit, the impedance of the first capacitor increases in a low-frequency domain, whereby the current of the input signal which is supplied to the input node flows to the reference potential through the first resistor, so that the first resistor consumes power. Thus, the gain reduces in the low-frequency domain, to prevent the transistor from oscillating. In a high-frequency domain, on the other hand, the impedance of the first capacitor sufficiently reduces below the resistance value of the first resistor, whereby no current of the input signal flows to the first resistor, so that the first resistor consumes no power. Thus, the transistor is stabilized mainly in the low-frequency domain.

Since the first capacitor is connected between the input node and the input-side electrode of the transistor, the resistance value of the first resistor can be relatively increased and the capacitance value of the first capacitor can be reduced in this case. Thus, the occupied areas of the first capacitor and the first resistor can be reduced.

The stabilizing circuit may further comprise a second resistor which is connected between the input-side electrode of the transistor and the reference potential.

In this case, the current flows to the second resistor which is connected between the input-side electrode of the transistor and the reference potential through the first capacitor in the high-frequency domain, so that the second resistor consumes power. Thus, the transistor is stabilized over all frequency domains.

The stabilizing circuit may further comprise a second capacitor which is connected between an output-side electrode of the transistor and the reference potential.

In this case, the second capacitor which is connected between the output-side electrode of the transistor and the reference potential reduces the impedance on the output side of the transistor as viewed from the input side. Thus, the signal is readily transmitted from the input side of the transistor to the output side, and the input reflection coefficient of the transistor reduces. Consequently, the transistor is prevented from oscillating in the high-frequency domain.

Thus, the first capacitor provided on the input side of the transistor and the first resistor prevent the transistor from oscillating in the low-frequency domain and the second capacitor provided on the output side of the transistor prevents the same from oscillating in the high-frequency domain, whereby the stabilizing circuit can stabilize the transistor in the low- and high-frequency domains while preventing reduction of the gain at a desired frequency by setting the desired frequency between the low- and high-frequency domains.

The stabilizing circuit may further comprise an inductance and a second capacitor which are connected in series between the output-side electrode of the transistor and the reference potential.

In this case, the inductance and the second capacitor connected to the output-side electrode of the transistor serve as band elimination filters. Thus, the stabilizing circuit can reduce the gain at a specific frequency.

When the transistor tends to oscillate at a specific frequency in the high-frequency domain, therefore, oscillation at the specific frequency can be prevented by reducing the gain at the specific frequency. Thus, the stabilizing circuit can stabilize the transistor in the low- and high-frequency domains while suppressing reduction of the gain at a desired frequency.

The inductance may include a line. In this case, the number of the components can be reduced since the line forms the inductance.

The capacitance value $C_0$ of the first capacitor and the resistance value $R_0$ of the first resistor preferably satisfy the following relation:

$$\omega_L < \frac{1}{R_0(C_0 + C_{gs})} < \omega_0$$

in relation to the input capacitance $C_{gs}$ of the transistor, the angular frequency $\omega_0$ of the signal to be transmitted and the angular frequency $\omega_L$ of a low-frequency component to be suppressed. Thus, the stabilizing circuit can suppress the low-frequency component of the angular frequency $\omega_L$ while transmitting the signal of the angular frequency $\omega_0$.

Alternatively, the capacitance value $C_0$ of the first capacitor and the resistance values $R_0$ and $R_1$ of the first and second resistors preferably satisfy the following relations:

$$R_0^2 > \frac{1 + \omega_0^2 R_1^2 (C_{gs} + C_0)^2}{\omega_0^4 R_1^2 C_0^2 C_{gs}^2 + \omega_0^2 C_0^2} \text{ and}$$

$$R_0^2 < \frac{1 + \omega_L^2 R_1^2 (C_{gs} + C_0)^2}{\omega_L^4 R_1^2 C_0^2 C_{gs}^2 + \omega_L^2 C_0^2}$$

in relation to the input capacitance $C_{gs}$ of the transistor, the angular frequency $\omega_0$ of the signal to be transmitted and the angular frequency $\omega_L$ of the low-frequency component to be suppressed. Thus, the stabilizing circuit can suppress the low-frequency component of the angular frequency $\omega_L$ while transmitting the signal of the angular frequency $\omega_0$.

The characteristic impedance $Z_a$ and the length $L_a$ of the line and the capacitance value $C_1$ of the second capacitor preferably satisfy the following relation:

$$L_a = \frac{\lambda_H}{2\pi} \tan^{-1} \frac{1}{C_1 \cdot \omega_H \cdot Z_a}$$

in relation to the angular frequency $\omega_H$ and the wave length $\lambda_H$ of a high-frequency component to be suppressed. Thus, the stabilizing circuit can suppress the high-frequency component of the angular frequency $\omega_H$ while transmitting the signal of the angular frequency $\omega_0$.

An amplifier according to another aspect of the present invention comprises a transistor, a first capacitor which is connected between an input node receiving an input signal and an input-side electrode of the transistor. The transistor may be a field-effect transistor.

In this amplifier, the impedance of the first capacitor increases in a low-frequency domain, whereby the current of the input signal which is supplied to the input node flows to the reference potential through the first resistor, so that the first resistor consumes power. Thus, the gain reduces in the low-frequency domain, to prevent the transistor from oscillating. In a high-frequency domain, on the other hand, the impedance sufficiently reduces below the resistance value of the first resistor, whereby no current of the input signal flows to the first resistor, so that the first resistor consumes no power. Thus, the amplifier stabilizes the transistor mainly in the low-frequency domain.

The amplifier may further comprise a second capacitor which is connected between an output-side electrode of the transistor and the reference potential.

In this case, the second capacitor which is connected between the output-side electrode of the transistor and the reference potential reduces the impedance on the output-side of the transistor as viewed from the input side. Thus, the signal is readily transmitted from the input side of the transistor to the output side, and the input reflection coefficient of the transistor reduces. Consequently, the transistor is prevented from oscillating in the low-frequency domain.

Thus, the first capacitor provided on the input side of the transistor and the first resistor prevent the transistor from oscillating in the low-frequency domain and the second capacitor provided on the output side of the transistor prevents the same from oscillating in the high-frequency domain, whereby the amplifier can stabilize the transistor in the low- and high-frequency domains while preventing reduction of the gain at a desired frequency by setting the desired frequency between the low- and high-frequency domains.

The amplifier may further comprise an inductance and a second capacitor which are connected in series between the output-side electrode of the transistor and the reference potential.

In this case, the inductance and the second capacitor connected between the output-side electrode of the transistor and the reference potential serve as band elimination filters. Thus, the amplifier can reduce the gain at a specific frequency.

When the transistor tends to oscillate at a specific frequency in the high-frequency domain, therefore, oscillation at the specific frequency can be prevented by reducing the gain at the specific frequency. Thus, the amplifier can stabilize the transistor in the low- and high-frequency domains while suppressing reduction of the gain at a desired frequency.

The inductance may include a line. In this case, the number of the components can be reduced since the line forms the inductance.

The capacitance value $C_0$ of the first capacitor and the resistance value $R_0$ of the first resistor preferably satisfy the following relation:

$$\omega_L < \frac{1}{R_0(C_0 + C_{gs})} < \omega_0$$

in relation to the input capacitance $C_{gs}$ of the transistor, the angular frequency $\omega_0$ of the signal to be transmitted and the angular frequency $\omega_L$ of a low-frequency component to be suppressed. Thus, the amplifier can suppress the low-frequency component of the angular frequency $\omega_L$ while transmitting the signal of the angular frequency $\omega_0$.

The amplifier may further comprise a second capacitor which is connected between an output-side electrode of the transistor and the reference potential.

The capacitance value $C_0$ of the first capacitor, the resistance value $R_0$ of the first resistor and the resistance value $R_1$ of a second resistor preferably satisfy the following relations:

$$R_0^2 > \frac{1 + \omega_0^2 R_1^2 (C_{gs} + C_0)^2}{\omega_0^4 R_1^2 C_0^2 C_{gs}^2 + \omega_0^2 C_0^2} \text{ and}$$

$$R_0^2 < \frac{1 + \omega_L^2 R_1^2 (C_{gs} + C_0)^2}{\omega_L^4 R_1^2 C_0^2 C_{gs}^2 + \omega_L^2 C_0^2}$$

in relation to the input capacitance $C_{gs}$ of the transistor, the angular frequency $\omega_0$ of the signal to be transmitted and the angular frequency $\omega_L$ of the low-frequency component to be suppressed. Thus, the amplifier can suppress the low-frequency component of the angular frequency $\omega_L$ while transmitting the signal of the angular frequency $\omega_0$.

The characteristic impedance $Z_a$ and the length $L_a$ of the line and the capacitance value $C_1$ of the second capacitor preferably satisfy the following relation:

$$L_a = \frac{\lambda_H}{2\pi} \tan^{-1} \frac{1}{C_1 \cdot \omega_H \cdot Z_a}$$

in relation to the angular frequency $\omega_H$ and the wave length $\lambda_H$ of a high-frequency component to be suppressed. Thus, the amplifier can suppress the high-frequency component of the angular frequency $\omega_H$ while transmitting the signal of the angular frequency $\omega_0$.

An amplifier according to still another aspect of the present invention comprises first and second transistors, a first capacitor which is connected between a first input node receiving an input signal and an input-side electrode of the first transistor, a first resistor which is connected between the first input node and a prescribed reference potential, a second capacitor which is connected between a second input node receiving an input signal and an input-side electrode of the second transistor, a second resistor which is connected between the second input node and the reference potential, a third capacitor which is connected between an output-side electrode of the first transistor and the reference potential, and a line and a fourth capacitor which are connected in series between an output-side electrode of the second transistor and the reference potential, and one of the first and second transistors is provided on a front stage while the other one of the first and second transistors is provided on a rear side.

In this amplifier, the first capacitor provided on the input side of the first transistor and the first resistor as well as the second capacitor provided on the input side of the second transistor and the second resistor prevent the first and second transistors from oscillating in a low-frequency domain. Further, the third capacitor provided on the output side of the first transistor prevents the first transistor from oscillating in a high-frequency domain. In addition, the line and the fourth capacitor provided on the output side of the second transistor prevent the second transistor from oscillating at a specific frequency in the high-frequency domain.

Thus, the amplifier can stabilize the first and second transistors in the low- and high-frequency domains while suppressing reduction of the gain at a desired frequency.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7(a) and 7(b) are circuit diagrams showing the stabilizing circuits according to the third and first embodiments of the present invention respectively, and FIG. 7(c) is a Smith chart showing simulation results of the frequency characteristics of S parameters $S_{21}$ in these stabilizing circuits;

DESCRIPTION OF THE PREFERRED EMBODIMENTS

Figure 1:
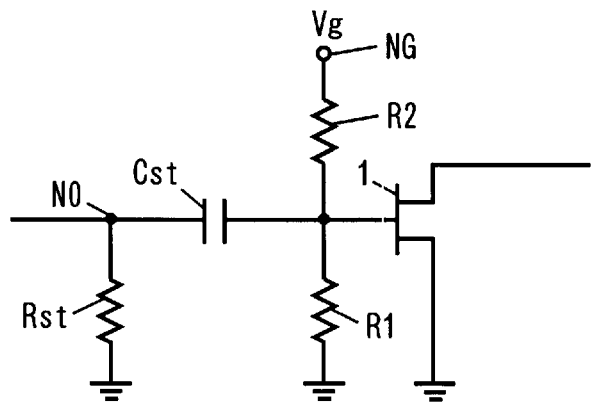
FIG. 1 is a circuit diagram of a stabilizing circuit according to a first embodiment of the present invention.

FIG. 1 is a circuit diagram of a stabilizing circuit according to a first embodiment of the present invention.

The stabilizing circuit shown in FIG. 1 is formed by a capacitor Cst and a resistor Rst. The capacitor Cst is connected between the gate of an FET 1 and an input node N0 receiving an input signal, and the resistor Rst is connected between the input node N0 and a ground terminal. The capacitance value of the capacitor Cst is several pF, and the resistance value of the resistor Rst is 100 to several 100 Ω, for example.

A resistor R1 is connected between the gate of the FET 1 and a ground terminal, and a resistor R2 is connected between the gate of the FET 1 and a power supply terminal NG receiving a power supply voltage Vg. The resistors R1 and R2 form a gate bias circuit for applying a gate bias to the gate of the FET 1.

In a low-frequency domain, the impedance of the capacitor Cst increases and hence a current flows to the resistor Rst so that the resistor Rst consumes power. In a high-frequency domain, on the other hand, the impedance of the capacitor Cst sufficiently reduces below the resistance value of the resistor Rst, whereby a current hardly flows to the resistor Rst and the resistor Rst consumes no power. Thus, the stabilizing circuit prevents the FET 1 from oscillating mainly in the low-frequency domain.

The capacitance value of the capacitor Cst can be reduced to several pF, whereby the occupied area of the capacitor Cst is reduced. Further, the resistance value of the resistor Rst can be increased to 100 to several 100 Ω, whereby the occupied area of the resistor Rst is reduced.

In the high-frequency domain, the current flows to the resistor R1 through the capacitor Cst, so that the resistor R1 consumes power. Therefore, the resistor R1 of the gate bias circuit also functions to stabilize the FET 1 over all frequency domains, while the capacitor Cst and the resistor Rst of the stabilizing circuit further stabilize the FET 1 on the low-frequency side also in this case.

Figure 2:
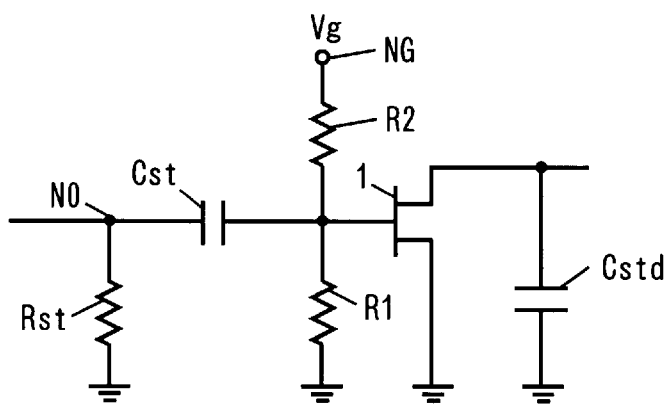
FIG. 2 is a circuit diagram of a stabilizing circuit according to a second embodiment of the present invention.

FIG. 2 is a circuit diagram of a stabilizing circuit according to a second embodiment of the present invention.

In the stabilizing circuit shown in FIG. 2, a capacitor Cstd is further provided on the drain side of an FET 1, in addition to elements identical to those of the stabilizing circuit shown in FIG. 1. This capacitor Cstd is connected between the drain of the FET 1 and a ground terminal.

In the stabilizing circuit shown in FIG. 2, the capacitor Cstd is connected to the drain of the FET 1, whereby the impedance on the output side (drain side) of the FET 1 as viewed from its gate side is reduced. Thus, the signal transmission characteristic of the FET 1 is improved, and its input reflection coefficient is reduced. Therefore, the FET 1 is prevented from oscillating in a high-frequency domain.

Thus, a capacitor Cst provided on the gate side of the FET 1 and a resistor Rst prevent the FET 1 from oscillating in the low-frequency domain, and the capacitor Cstd provided on the drain side prevents the same from oscillating in the high-frequency domain in the stabilizing circuit shown in FIG. 2. Therefore, the values of the respective elements are so designed as to set a desired frequency (working frequency) at a level between the low-frequency domain in which the capacitor Cst and the resistor Rst stabilize the FET 1 and the high-frequency domain in which the capacitor Cstd stabilizes the FET 1. Thus, the stabilizing circuit can stabilize the FET 1 in the low- and high-frequency domains while suppressing reduction of the gain at the desired frequency.

Figure 3:
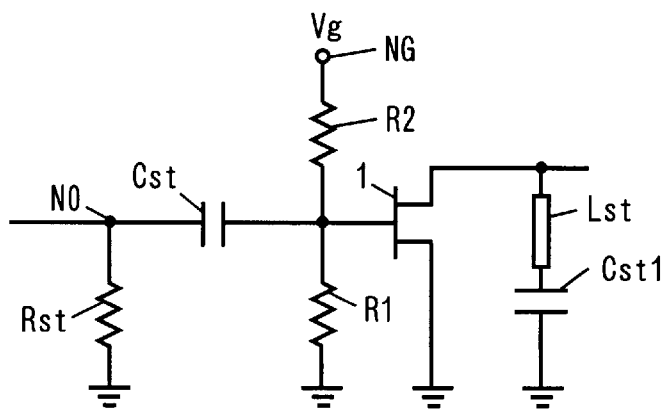
FIG. 3 is a circuit diagram of a stabilizing circuit according to a third embodiment of the present invention.

FIG. 3 is a circuit diagram of a stabilizing circuit according to a third embodiment of the present invention.

In the stabilizing circuit shown in FIG. 3, a line Lst and a capacitor Cst1 are provided on the drain side of an FET 1, in addition to elements identical to those of the stabilizing circuit shown in FIG. 1. The line Lst and the capacitor Cst are connected in series between the drain of the FET 1 and a ground terminal.

The line Lst and the capacitor Cst1 serve as band elimination filters, which can reduce the gain at a specific frequency. When the FET 1 tends to oscillate at a specific frequency in a high-frequency domain, therefore, the stabilizing circuit shown in FIG. 3 can prevent the FET 1 from oscillating by reducing the gain at the specific frequency.

The line Lst is formed by a microstrip line, for example. The microstrip line is equivalent to an inductance due to the relation between the length and the width thereof and the frequency. Therefore, the length and the width are so set that the microstrip line is inductive at the specific frequency.

Thus, a capacitor Cst provided on the gate side and a resistor Rst prevent the FET 1 from oscillating in a low-frequency domain and the line Lst and the capacitor Cst1 provided on the drain side prevent the FET 1 from oscillating at the specific frequency in the high-frequency domain in the stabilizing circuit shown in FIG. 3. When the FET 1 tends to oscillate at the specific frequency, therefore, the stabilizing circuit can stabilize the FET 1 in the low- and high-frequency domains while suppressing reduction of the gain at a desired frequency (working frequency).

In each of the first to third embodiments, the gate and the drain of the FET 1 correspond to the input- and output-side electrodes respectively. Further, the ground potential of the ground terminal corresponds to the reference potential.

Figure 4A:
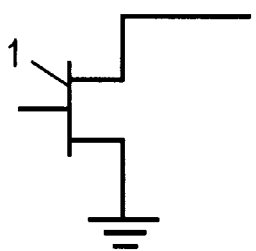
FIG. 4(a) is a circuit diagram showing a single FET.
Figure 4B:
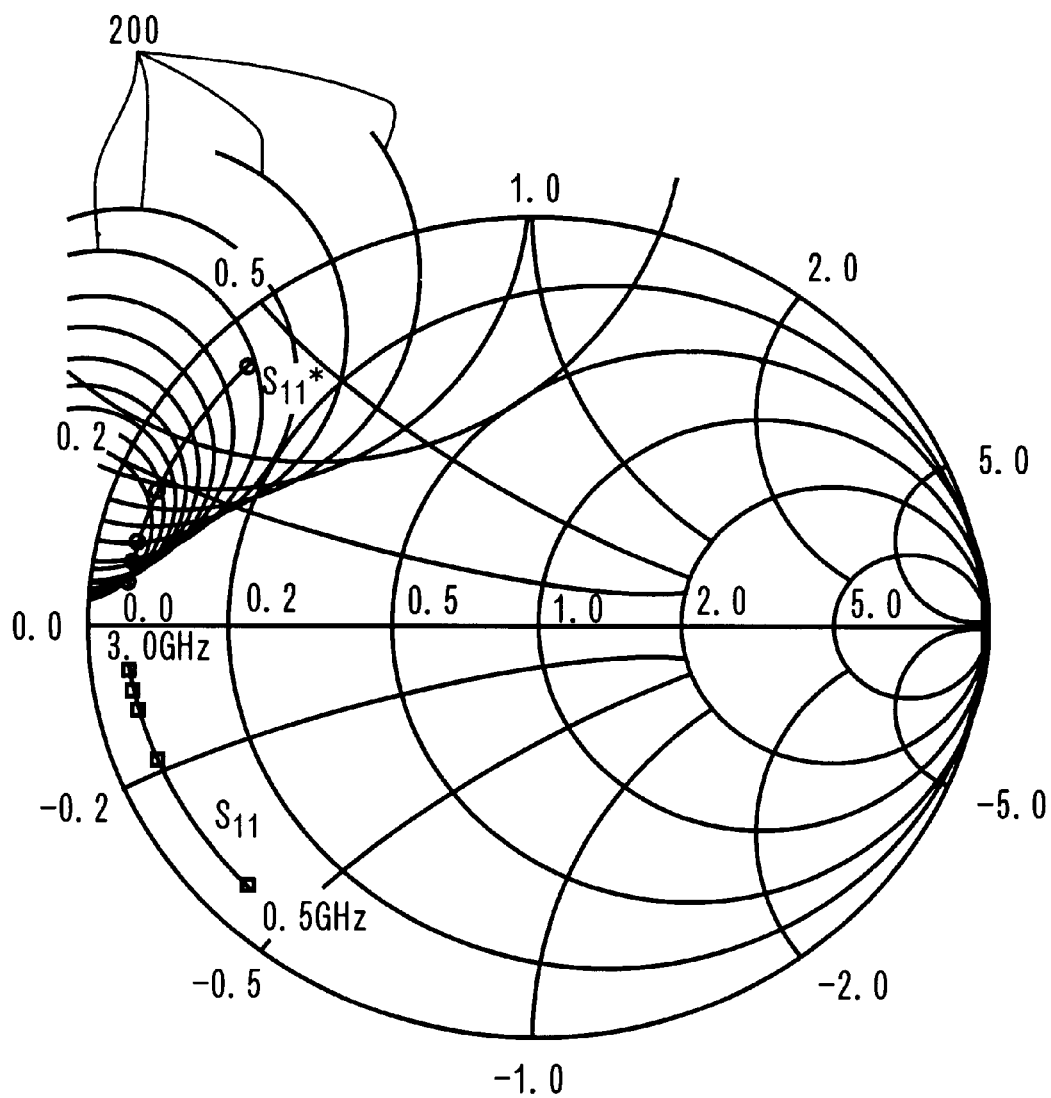
FIG. 4(b) is a Smith chart showing simulation results of an S parameter $S_{11}$ and stability circles in this FET.

FIG. 4(a) is a circuit diagram showing a single FET 1, and FIG. 4(b) is a Smith chart showing simulation results of an S parameter $S_{11}$, indicating the input reflection coefficient, and stability circles. In this simulation, the drain and gate voltages of the FET 1 were set at 3.5 V and −0.35 V respectively.

Referring to FIG. 4(b), squares show measured values of the S parameter $S_{11}$ (input reflection coefficient) in the frequency range of 0.5 to 3.0 GHz, and circles show conjugate S parameters $S_{11}^*$ of the S parameter $S_{11}$. The FET 1 is unstable and tends to oscillate when the conjugate S parameters $S_{11}^*$ are in stability circles 200.

Figure 5A:
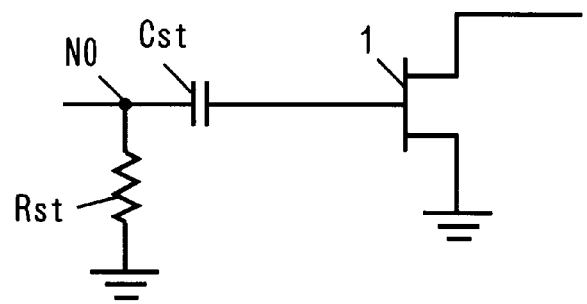
FIG. 5(a) is a circuit diagram showing the stabilizing circuit according to the first embodiment of the present invention.
Figure 5B:
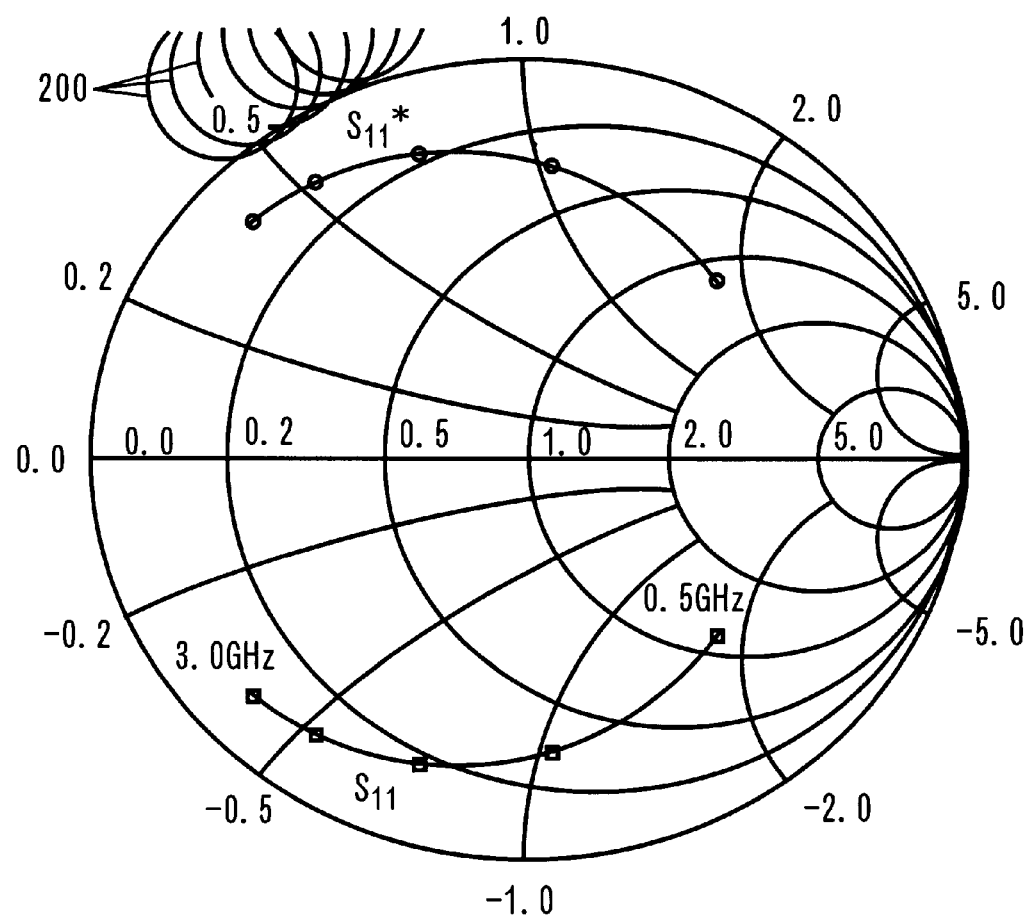
FIG. 5(b) is a Smith chart showing simulation results of an S parameter $S_{11}$ and stability circles in this stabilizing circuit.

FIG. 5(a) is a circuit diagram showing the stabilizing circuit according to the first embodiment shown in FIG. 1, and FIG. 5(b) is a Smith chart showing simulation results of an S parameter $S_{11}$ and stability circles in the stabilizing circuit shown in FIG. 5(a). In this simulation, the capacitance value of the capacitor Cst and the resistance value of the resistor Rst were set at 3 pF and 200 Ω respectively.

Also in FIG. 5(b), squares show measured values of the S parameter $S_{11}$ in the frequency range of 0.5 to 3.0 GHz, and circles show conjugate S parameters $S_{11}*$ of the S parameter $S_{11}$. In the example shown in FIG. 5(b), the conjugate S parameters $S_{11}*$ are substantially out of stability circles 200 regardless of the values of the S parameter $S_{11}$, whereby the FET 1 is stable, not to oscillate.

Table 1 shows K values (stability factors) of the single FET 1 shown in FIG. 4(a) and the FET 1 in the stabilizing circuit according to the first embodiment shown in FIG. 5(a).

TABLE 1

| Frequency [GHz] | K Value | |
|---|---|---|
| | Single FET | First Embodiment (with Rst and Cst) |
| 0.5 | 0.0523 | 3.7613 |
| 0.7 | 0.0767 | 2.7012 |
| 0.9 | 0.0795 | 2.1130 |
| 1.1 | 0.1022 | 1.7725 |
| 1.3 | 0.1201 | 1.5293 |
| 1.5 | 0.1423 | 1.3527 |
| 1.7 | 0.1585 | 1.2175 |
| 1.9 | 0.1798 | 1.1261 |
| 2.1 | 0.2027 | 1.0550 |
| 2.3 | 0.2198 | 0.9917 |
| 2.5 | 0.2432 | 0.9492 |
| 2.7 | 0.2604 | 0.9104 |
| 2.9 | 0.2866 | 0.8919 |

As shown in Table 1, the K value is smaller than 1 over the frequency range of 0.5 to 2.9 GHz in the single FET 1. In the stabilizing circuit according to the first embodiment, on the other hand, the K value is larger than 1 in the frequency range of 0.5 to 2.1 GHz. Consequently, it is understood that the stabilizing circuit according to the first embodiment stabilizes the FET 1 in the low-frequency domain.

Figure 6A:
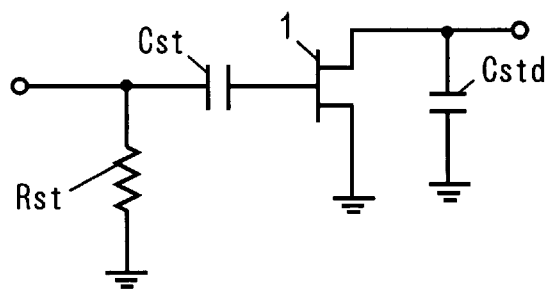
FIG. 6(a) is a circuit diagram showing the stabilizing circuit according to the second embodiment of the present invention.
Figure 6B:
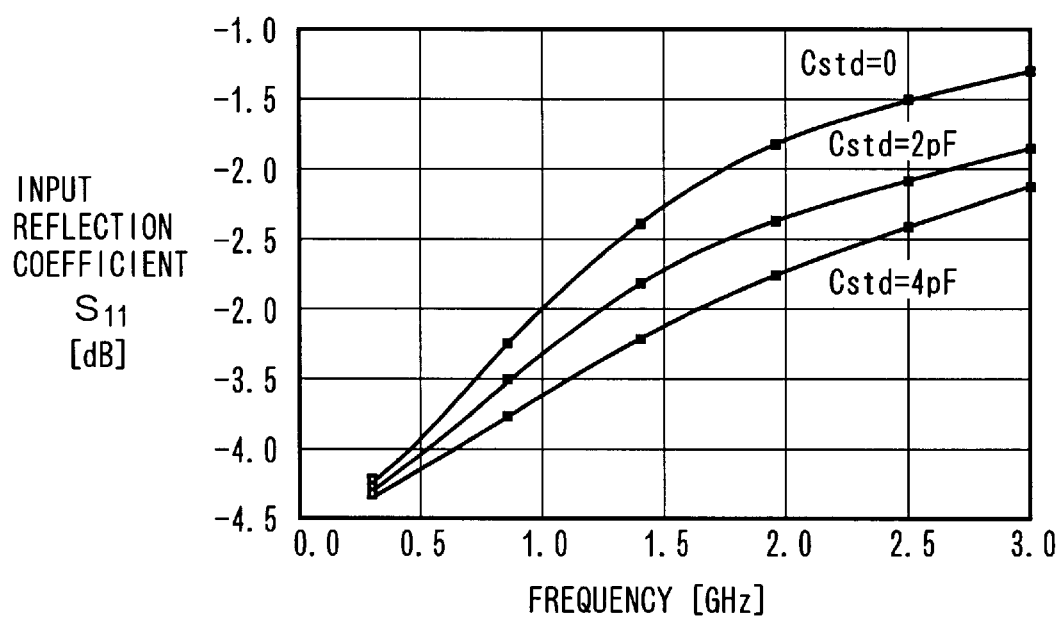
FIG. 6(b) is a Smith chart showing a simulation result of the frequency characteristic of an S parameter $S_{11}$ in this stabilizing circuit.

FIG. 6(a) is a circuit diagram showing the stabilizing circuit according to the second embodiment shown in FIG. 2, and FIG. 6(b) illustrates simulation results of the frequency characteristic of the S parameter $S_{11}$ in the stabilizing circuit shown in FIG. 6(a). In this simulation, the frequency characteristic of the S parameter $S_{11}$ was measured while setting the capacitor Cstd at values of 0 pF, 2 pF and 4 pF.

As shown in FIG. 6(b), the S parameter $S_{11}$ remains substantially unchanged regardless of presence/absence of the capacitor Cstd and its capacitance value in the low frequency domain, while the S parameter $S_{11}$ remarkably varies with the presence/absence of the capacitor Cstd and its capacitor value in the high-frequency domain. In addition, the S parameter $S_{11}$ reduces as the capacitance value of the capacitor Cstd increases. Thus, it is understood that the capacitor Cstd reduces the S parameter $S_{11}$ in the high-frequency domain in the stabilizing circuit according to the second embodiment.

Thus, the stabilizing circuit according to the second embodiment reduces the input reflection coefficient in the high-frequency domain and inhibits the FET 1 from oscillating.

FIG. 7(a) is a circuit diagram showing the stabilizing circuit according to the third embodiment shown in FIG. 3, FIG. 7(b) is a circuit diagram showing the stabilizing circuit according to the first embodiment shown in FIG. 1, and FIG. 7(c) illustrates simulation results of the frequency characteristics of S parameters $S_{21}$, indicating gains, in the stabilizing circuits of FIGS. 7(a) and 7(b) respectively. In this simulation, the width and the length of the line Lst were set at 200 μm and 1200 μm respectively, and the capacitance value of the capacitor Cst1 was set at 7.0 pF.

Referring to FIG. 7(c), solid lines A and B show measured values of the S parameters $S_{21}$ in the stabilizing circuits shown in FIGS. 7(a) and 7(b) respectively.

As shown in FIG. 7(c), the S parameter $S_{21}$ can be locally remarkably reduced by providing the line Lst and the capacitor Cst1 on the drain side of the FET 1.

As hereinabove described, the stabilizing circuit according to the second or third embodiment of the present invention can stabilize the FET 1 by increasing the K value beyond 1 while suppressing reduction of the gain at a desired frequency and reducing the gain at the remaining frequencies.

The input voltage in the gate of the FET 1 remarkably varies in a power amplifier, for example. Therefore, a load line in the power amplifier is over a wide range of drain current-drain voltage characteristics. If the FET 1 is stabilized only in the low-frequency domain, therefore, the FET 1 may be unstabilized in operation due to the remarkably varying input voltage in its gate, even if the same is stable in an idle state. Particularly when the gate bias is limited around a pinch-off voltage, the gate-to-source capacitance of the FET 1 so reduces that the frequency range allowing appearance of negative resistance extends toward the high-frequency side. Therefore, the FET 1 is readily unstabilized to oscillate when the operating point shifts to such a state. The stabilizing circuit according to each of the second and third embodiments of the present invention can sufficiently stabilize the FET 1 also in this case.

Figure 8:
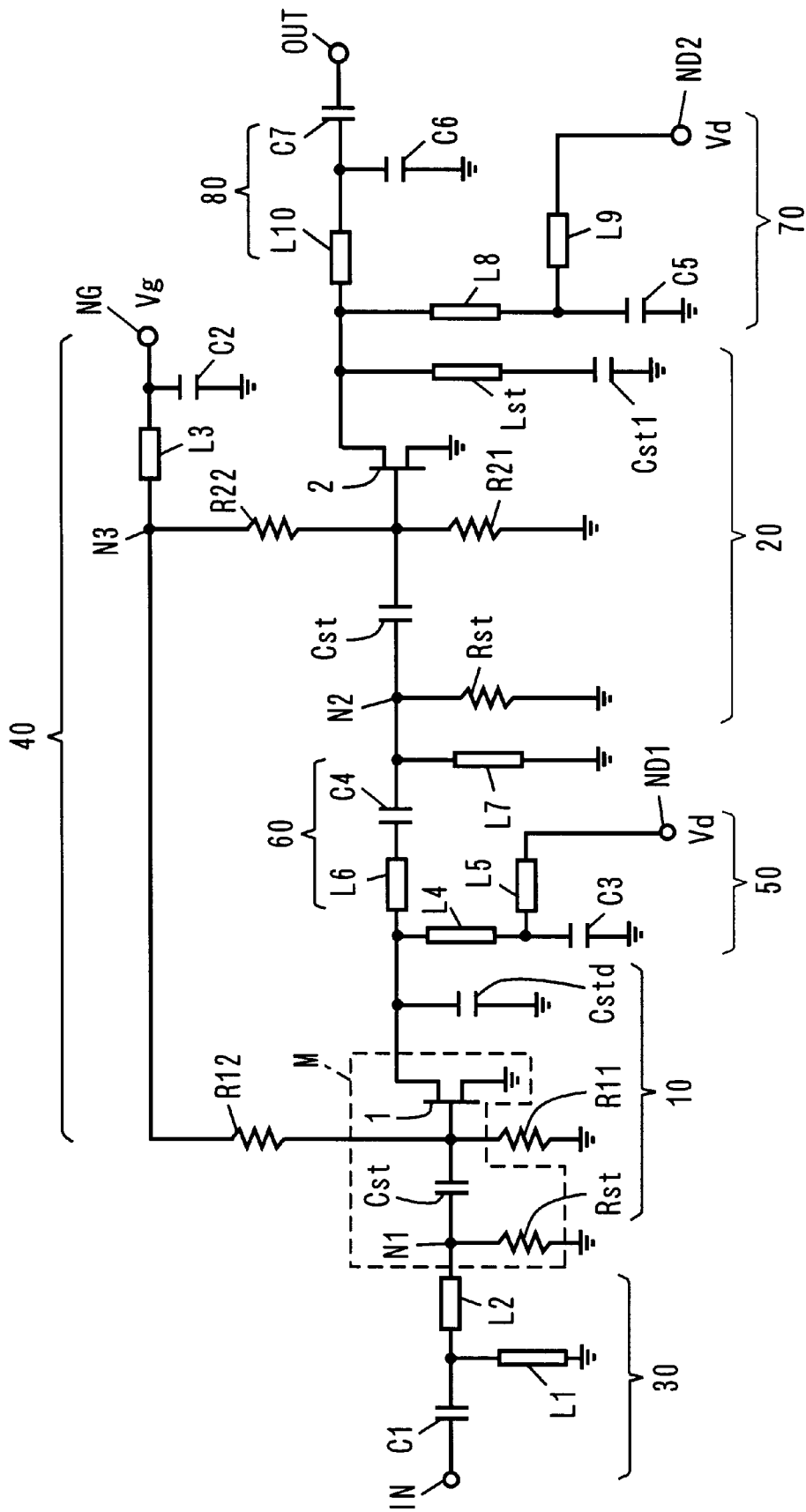
FIG. 8 illustrates an exemplary two-stage amplifier employing the stabilizing circuits according to the second and third embodiments of the present invention.

FIG. 8 is a circuit diagram showing an exemplary two-stage amplifier designed with the stabilizing circuits according to the second and third embodiments of the present invention. This two-stage amplifier forms a power amplifier module as a whole. The two-stage amplifier shown in FIG. 8 is used at a frequency of 1.45 GHz.

Referring to FIG. 8, the two-stage amplifier includes a first-stage stabilizing circuit 10 including an FET 1, a second-stage stabilizing circuit 20 including an FET 2, a matching circuit 30, a gate bias circuit 40, a drain bias circuit 50, a matching circuit 60, a drain bias circuit 70 and a matching circuit 80.

In the stabilizing circuit 10, a capacitor Cst is connected between the gate of the FET 1 and an input node N1, and a resistor Rst is connected between the input node N1 and a ground terminal. Further, a capacitor Cstd is connected between the drain of the FET 1 and a ground terminal. This stabilizing circuit 10 corresponds to the second embodiment shown in FIG. 2.

In the stabilizing circuit 20, a capacitor Cst is connected between the gate of the FET 2 and an input node N2, and a resistor Rst is connected between the input node N2 and a ground terminal. Further, a line Lst and a capacitor Cst1 are connected in series between the drain of the FET 2 and a ground terminal. This stabilizing circuit 20 corresponds to the third embodiment shown in FIG. 3.

In the matching circuit 30, a capacitor C1 and a line L2 are connected in series between an input terminal IN and the input node N1, and the node between the capacitor C1 and the line L2 is connected to a ground terminal through a line L1.

In the gate bias circuit 40, a resistor R11 is connected between the gate of the FET 1 and a ground terminal, a resistor R12 is connected between the gate of the FET 1 and a node N3, a resistor R21 is connected between the gate of the FET 2 and a ground terminal, and a resistor R22 is connected between the gate of the FET 2 and the node N3. Further, a line L3 is connected between the node N3 and a power supply terminal NG receiving a power supply voltage Vg, and a capacitor C2 is connected between the power supply terminal NG and a ground terminal. This gate bias circuit 40 applies prescribed gate biases to the gates of the FETs 1 and 2 respectively.

In the drain bias circuit 50, a line L4 and a capacitor C3 are connected in series between the drain of the FET 1 and a ground terminal, and a line L5 is connected between the node of the line L4 and the capacitor C3 and a power supply terminal ND1 receiving a power supply voltage Vd. This drain bias circuit 50 applies a prescribed drain bias to the drain of the FET 1.

In the matching circuit 60, a line L6 and a capacitor C4 are connected in series between the drain of the FET 1 and the input node N2, and a line L7 is connected between the input node N2 and a ground terminal.

In the drain bias circuit 70, a line L8 and a capacitor C5 are connected in series between the drain of the FET 2 and a ground terminal, and a line L9 is connected between the node of the line L8 and the capacitor C5 and a power supply terminal VD2 receiving the power supply voltage Vd. This drain bias circuit 70 applies a prescribed drain bias to the drain of the FET 2.

In the matching circuit 80, a line L10 and a capacitor C7 are connected in series between the drain of the FET 2 and an output terminal OUT, and a capacitor C6 is connected between the node of the line L10 and the capacitor C7 and a ground terminal.

In the two-stage amplifier shown in FIG. 8, the resistor Rst, the capacitor Cst and the FET 1 enclosed with broken lines M are formed by an MMIC (microwave monolithic integrated circuit).

Figure 9:
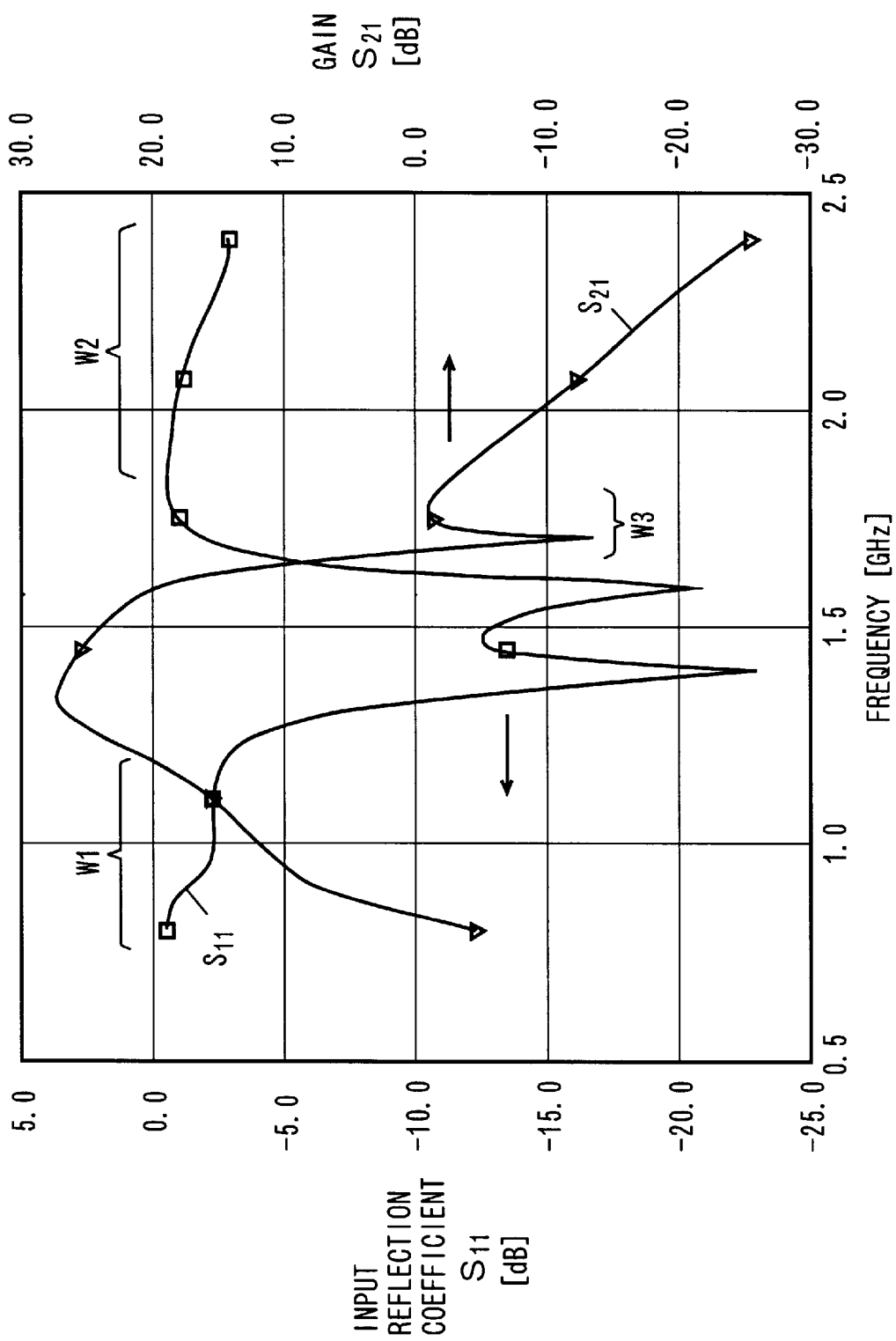
FIG. 9 illustrates simulation results of the frequency characteristics of S parameters $S_{11}$ and $S_{21}$ in the two-stage amplifier shown in FIG. 8.

FIG. 9 illustrates simulation results of frequency characteristics of S parameters $S_{11}$ (input reflection coefficient) and $S_{21}$ (gain) in the two-stage amplifier shown in FIG. 8.

As shown in FIG. 9, the S parameter $S_{11}$ is smaller than zero in a low-frequency domain W1, due to the effects of the resistors Rst and the capacitors Cst of the stabilizing circuits 10 and 20. Further, the S parameter Sol is loosely reduced in a high-frequency domain W2, due to the effect of the capacitor Cstd of the stabilizing circuit 10. Thus, the FETs 1 and 2 are stabilized not to oscillate in the low- and high-frequency domains W1 and W2.

Further, a downward dip appears in the S parameter $S_{21}$ in a domain W3 including a frequency of 1.7 GHz, due to the effects of the line Lst and the capacitor Cst1 of the stabilizing circuit 20. Thus, the FETs 1 and 2 are prevented from oscillating in the domain W3 around the frequency of 1.7 GHz.

Table 2 shows calculation results of the K value (stability factor) in the two-stage amplifier shown in FIG. 8.

TABLE 2

| Frequency [GHz] | K Value | Frequency [GHz] | K Value |
|---|---|---|---|
| 0.80 | 484.32 | 1.65 | 18.799 |
| 0.85 | 181.39 | 1.70 | 407.29 |
| 0.90 | 88.720 | 1.75 | 58.574 |

TABLE 2-continued

| Frequency [GHz] | K Value | Frequency [GHz] | K Value |
|---|---|---|---|
| 0.95 | 72.431 | 1.80 | 20.307 |
| 1.00 | 51.568 | 1.85 | 16.507 |
| 1.05 | 39.803 | 1.90 | 19.718 |
| 1.10 | 27.813 | 1.95 | 27.059 |
| 1.15 | 17.757 | 2.00 | 36.978 |
| 1.20 | 10.278 | 2.05 | 48.721 |
| 1.25 | 6.0875 | 2.10 | 67.254 |
| 1.30 | 3.9481 | 2.15 | 91.419 |
| 1.35 | 3.0337 | 2.20 | 123.02 |
| 1.40 | 3.2806 | 2.25 | 163.94 |
| 1.45 | 3.7715 | 2.30 | 218.60 |
| 1.50 | 4.2093 | 2.35 | 288.31 |
| 1.55 | 4.8878 | 2.40 | 417.84 |
| 1.60 | 7.2173 | | |

As shown in Table 2, the K value increases in the frequency domain of 0.80 to 1.05 GHz, due to the effects of the capacitors Cst and the resistors Rst of the stabilizing circuits 10 and 20. Further, the K value increases in the frequency domain of 1.65 to 1.75 GHz due to the effects of the line Lst and the capacitor Cst1 of the stabilizing circuit. The K value is larger than 1 also at the working frequency of 1.50 GHz. Thus, the K value increases beyond 1 in the overall frequency range of 0.80 to 2.40 GHz.

Thus, the FETs 1 and 2 are stabilized in the low- and high-frequency domains, and the K value exceeds 1 also at the working frequency.

Conditions for suppressing a desired low-frequency component in the stabilizing circuit according to each of the aforementioned embodiments are now described.

Figure 10A:
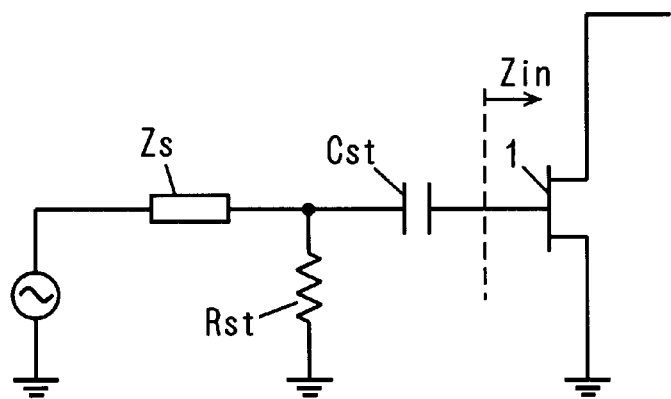
FIGS. 10(a) and 10(b) are adapted to illustrate conditions for suppressing a desired low-frequency component when no resistor is connected to the gate of an FET.
Figure 10B:
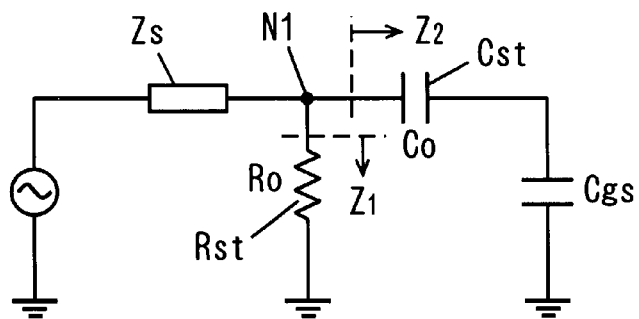

FIG. 10(a) is a circuit diagram of a stabilizing circuit, and FIG. 10(b) is an equivalent circuit diagram of the stabilizing circuit shown in FIG. 10(a).

Referring to FIG. 10(a), symbol $Z_{in}$ denotes the impedance on an output side as viewed from the gate side of an FET 1. Referring to FIG. 10(b), symbol $C_{gs}$ denotes the gate-to-source capacitance of the FET 1, where $Z_{in}=C_{gs}$. Further, symbol $Z_1$ denotes the impedance of a resistor Rst as viewed from a node N1, and symbol $Z_2$ denotes the impedance of a capacitor Cst as viewed from the node N1. It is assumed that $R_0$ and $C_0$ represent the resistance value of the resistor Rst and the capacitance value of the capacitor Cst respectively.

The following expressions hold in FIG. 10(b):

$$Z_1 = R_0$$

$$Y_2 = 1/Z_2 = j\omega(C_0 + C_{gs})$$

where $Y_2$ represents the admittance of the capacitor Cst as viewed from the node N1, and $\omega$ represents an angular frequency.

It is assumed that $\omega_0$ represents the angular frequency of a high-frequency signal. In order to transmit the signal to the FET 1 at the angular frequency $\omega_0$, the following expression must be satisfied:

$$|Z_1| > |Z_2(\omega_0)|$$

where $Z_2(\omega_0)$ represents the impedance of the capacitor Cst at the angular frequency $\omega_0$ as viewed from the node N1. Thus, the following expression holds:

$$1/R_0 < \omega_0(C_0 + C_{gs})$$

Hence, the condition of the following expression is obtained:

$$\omega_0 > \frac{1}{R_0(C_0 + C_{gs})} \quad (1)$$

It is assumed that $\omega_L$ represents the angular frequency of a low-frequency signal component to be suppressed. In order to make the resistor Rst consume the low-frequency component of the angular frequency $\omega_L$, the following expression must be satisfied:

$$|Z_1| > |Z_2(\omega_L)|$$

where $Z_2(\omega_L)$ represents the impedance of the capacitor Cst at the angular frequency $\omega_L$ as viewed from the node N1. Thus, the following expression holds:

$$1/R_0 < \omega_L(C_0 + C_{gs})$$

Hence, the condition of the following expression is obtained:

$$\omega_L < \frac{1}{R_0(C_0 + C_{gs})} \quad (2)$$

The condition of the following expression is obtained from the above expressions (1) and (2):

$$\omega_L < \frac{1}{R_0(C_0 + C_{gs})} < \omega_0$$

From these results, the angular frequency $\omega_0$ of the signal to be transmitted, the angular frequency $\omega_L$ of the low-frequency component to be suppressed, the resistance value $R_0$ of the resistor Rst and the capacitance value $C_0$ of the capacitor Cst are so set that the relation of the above expression (A) holds.

Conditions for suppressing a desired high-frequency component in the stabilizing circuit according to each of the aforementioned embodiments are now described.

Figure 11:
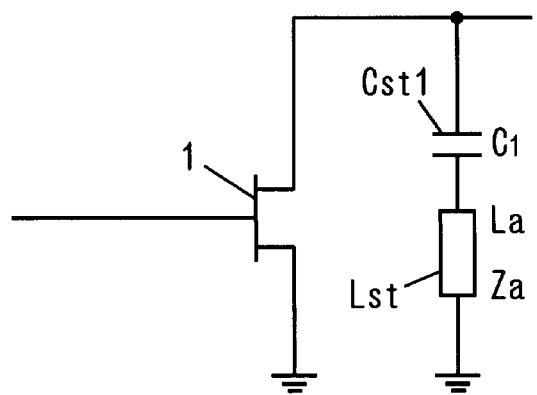
FIG. 11 is adapted to illustrate conditions for suppressing a desired high-frequency component.

FIG. 11 is a circuit diagram showing a part suppressing a high-frequency component in a stabilizing circuit. Referring to FIG. 11, symbols $C_1$, $Z_a$ and $L_a$ denote the capacitance value of a capacitor Cst1 and the characteristic impedance and the length of a line Lst respectively.

It is assumed that the capacitor Cst1 and the line Lst suppress the high-frequency component of an angular frequency $\omega_H$ by resonance thereof. The resonance condition is as follows:

$$\omega_H^2 = 1/(L_1 C_1)$$

where $L_1$ represents the reactance of the line Lst. Hence, the reactance $L_1$ is expressed as follows:

$$L_1 = 1/(C_1 \omega_H^2)$$

The impedance of the line Lst is expressed as $jZ_a \cdot \tan\{(2\pi/\lambda_H) \cdot L_a\}$, where $\lambda_H$ represents the wavelength of the high-frequency component having the angular frequency $\omega_H$. Hence, the following expression holds:

$$j\omega_H L_1 = jZ_a \cdot \tan\{(2\pi/\lambda_H) \cdot L_a\}$$

Substituting the expression of the reactance $L_1$ in the above expression, the following expression is obtained:

$$j\omega_H \{1/(C_1 \omega_H^2)\} = jZ_a \cdot \tan\{(2\pi/\lambda_H) \cdot L_a\}$$

Hence, the condition of the following expression is obtained:

$$L_a = \frac{\lambda_H}{2\pi} \tan^{-1} \frac{1}{C_1 \cdot \omega_H \cdot Z_a} \quad (B)$$

From these results, the angular frequency $\omega_H$ of the high-frequency component to be suppressed, the capacitance value $C_1$ of the capacitor Cst1, and the characteristic impedance $Z_a$ and the length $L_a$ of the line Lst are so set that the relation of the above expression (B) holds.

When the conditions of the above expressions (A) and (B) are satisfied, therefore, the low- and high-frequency components of the angular frequencies $\omega_L$ and $\omega_H$ can be suppressed while transmitting the signal of the angular frequency $\omega_0$.

Conditions for suppressing a desired low-frequency component in case of connecting the resistor R1 to the gate of the FET 1 are now described.

Figure 12A:
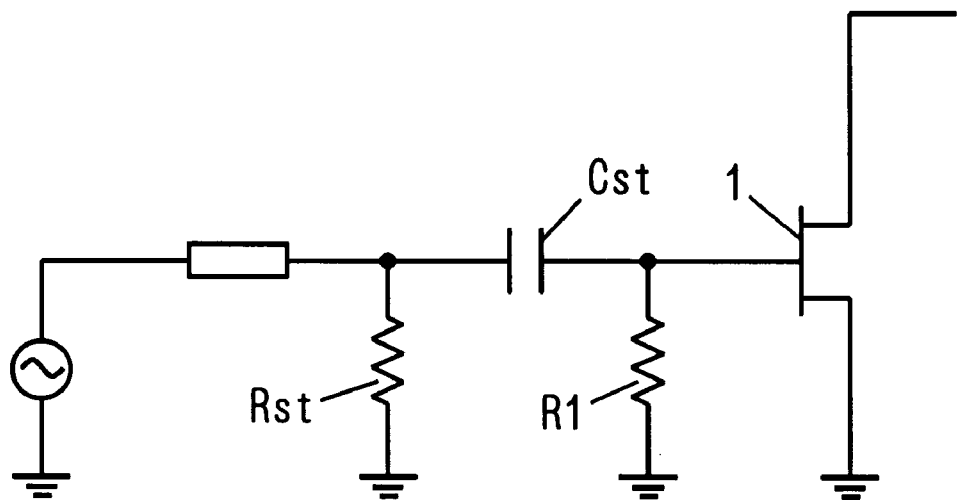
FIGS. 12(a) and 12(b) are adapted to illustrate conditions for suppressing a desired low-frequency component when a resistor is connected to the gate of the FET.
Figure 12B:
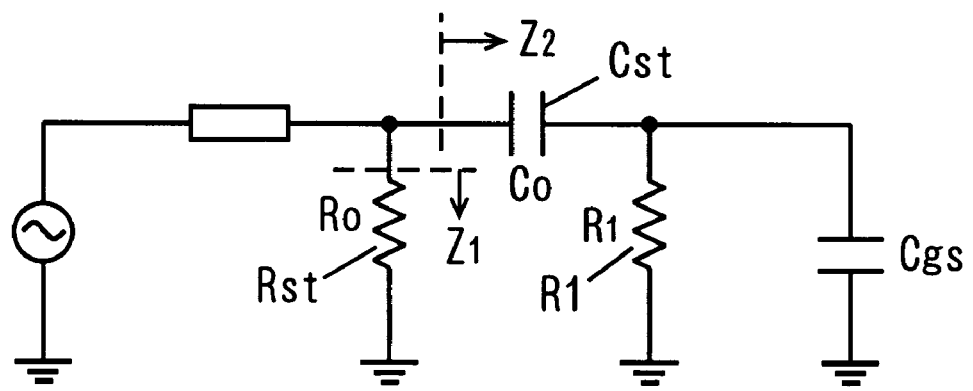
Figure 13:
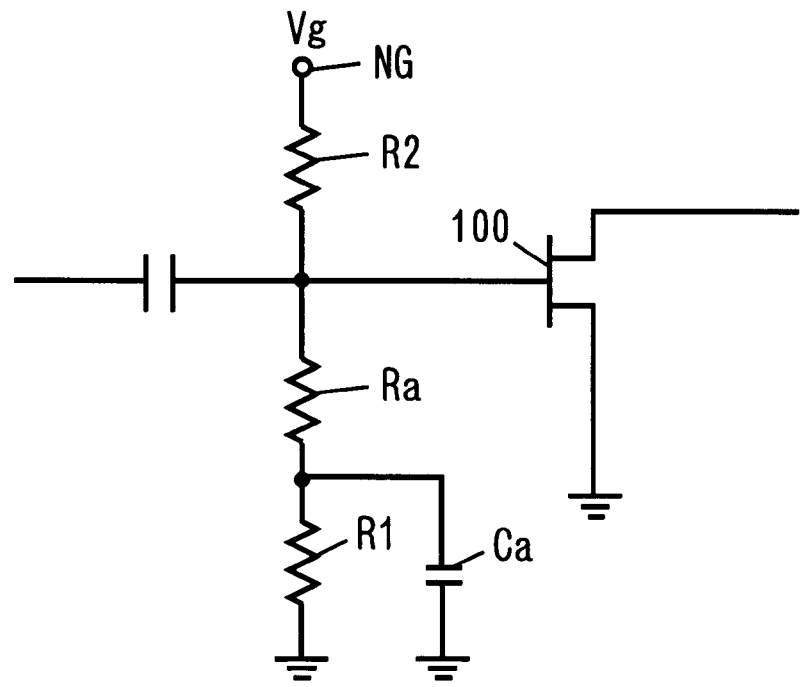
FIG. 13 illustrates an exemplary conventional stabilizing circuit.
Figure 14:
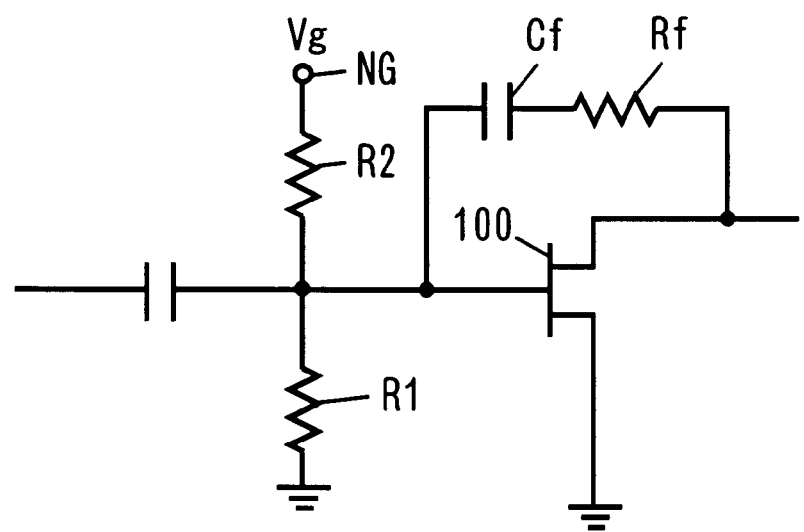
FIG. 14 is a circuit diagram showing another exemplary conventional stabilizing circuit.

FIG. 12(a) is a circuit diagram of a stabilizing circuit, and FIG. 12(b) is an equivalent circuit diagram of the stabilizing circuit shown in FIG. 12(a).

In the stabilizing circuit shown in FIG. 12(a), a resistor R1 is connected between the gate of an FET 1 and a ground potential. It is assumed that symbols $C_{gs}$, $R_0$, $C_0$ and $R_1$ represent the gate-to-source capacitance of the FET 1, the resistance value of a resistor Rst, the capacitance value of a capacitor Cst and the resistance value of the resistor R1 respectively. It is also assumed that symbols $Z_1$ and $Z_2$ represent the impedances of the resistor Rst and the capacitor Cst as viewed from a node N1 respectively. The impedance $Z_2$ is expressed as follows:

$$Z_2 = \frac{1}{j\omega C_0} + \frac{1}{\frac{1}{R_1} + j\omega C_{gs}}$$

$$= \frac{1}{j\omega C_0} + \frac{R_1}{1 + j\omega R_1 C_{gs}}$$

$$= \frac{1 + j\omega R_1 C_{gs} + R_1 \cdot j\omega C_0}{j\omega C_0 (1 + j\omega R_1 C_{gs})}$$

$$= \frac{1 + j\omega R_1 (C_{gs} + C_0)}{-\omega^2 R_1 C_0 C_{gs} + j\omega C_0}$$

Hence, the absolute value $|Z_2|$ of the impedance $Z_2$ is expressed as follows:

$$|Z_2| = \frac{\sqrt{1 + \omega^2 (R_1^2 (C_{gs} + C_0))^2}}{\sqrt{\omega^2 C_0^2 + \omega^4 R_1^2 C_0^2 C_{gs}^2}}$$

It is assumed that $\omega_0$ represents the angular frequency of a high-frequency signal. In order to transmit the signal to the FET 1 at the angular frequency $\omega_0$, the following expression must be satisfied:

$$R_0 > |Z_2(\omega_0)|$$

where $Z_2(\omega_0)$ represents the impedance of the capacitor Cst at the angular frequency $\omega_0$ as viewed from the node N1. Hence, the condition of the following expression is obtained:

$$R_0^2 > \frac{1 + \omega_0^2 R_1^2 (C_{gs} + C_0)^2}{\omega_0^4 R_1^2 C_0^2 C_{gs}^2 + \omega_0^2 C_0^2} \quad \text{(C)}$$

It is assumed that $\omega_L$ represents the angular frequency of a low-frequency component to be suppressed. In order to make the resistor Rst consume the low-frequency component of the angular frequency $\omega_L$, the following expression must be satisfied:

$$R_0 > |Z_2(\omega_L)|$$

where $Z_2(\omega_L)$ represents the impedance of the capacitor Cst at the angular frequency $\omega_L$ as viewed from the node N1. Hence, the condition of the following expression is obtained:

$$R_0^2 < \frac{1 + \omega_L^2 R_1^2 (C_{gs} + C_0)^2}{\omega_L^4 R_1^2 C_0^2 C_{gs}^2 + \omega_L^2 C_0^2} \quad \text{(D)}$$

From these results, the angular frequency (oo of the signal to be transmitted, the angular frequency $\omega_L$ of the low-frequency component to be suppressed, the resistance values $R_0$ and $R_1$ of the resistors Rst and R1 and the capacitance value $C_0$ of the capacitor Cst are so set that the relations of the above expressions (C) and (D) hold.

When the conditions of the above expressions (B), (C) and (D) are satisfied, therefore, the low- and high-frequency components of the angular frequencies $\omega_L$ and $\omega_H$ can be suppressed while transmitting the signal of the angular frequency $\omega_0$.

Although the single gate type FET has been described in the above embodiments, the present invention can be applied to dual gate type FETs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A stabilizing circuit for stabilizing a transistor, comprising:
 a first capacitor being directly connected between an input node receiving an input signal and an input-side electrode of said transistor; and
 a first resistor being directly connected between said input node and a prescribed reference potential, wherein the values of said first capacitor and said first resistor are set so that said first resistor consumes power in a predetermined low-frequency domain thereby preventing said transistor from oscillation in the low-frequency domain.

2. The stabilizing circuit in accordance with claim 1, further comprising a second resistor being connected between said input-side electrode of said transistor and said reference potential, wherein the values of said first capacitor, said first resistor and said second resistor are set so that said second resistor consumes power in a predetermined high-frequency domain thereby preventing said transistor from oscillation in high-frequency domain. further comprising a second 3. The stabilizing circuit in accordance with claim 1, further comprising a second capacitor being connected between an output-side electrode of said transistor and said reference potential.

4. The stabilizing circuit in accordance with claim 1, further comprising an inductance and a second capacitor being connected in series between an output-side electrode of said transistor and said reference potential.

5. The stabilizing circuit in accordance with claim 4, wherein
 said inductance includes a transmission line.

6. The stabilizing circuit in accordance with claim 2, further comprising an inductance and a second capacitor being connected in series between an output-side electrode of said transistor and said reference potential.

7. The stabilizing circuit in accordance with claim 6, wherein
 said inductance includes a transmission line.

8. The stabilizing circuit in accordance with claim 1, wherein
 the capacitance value $C_0$ of said first capacitor and the resistance value $R_0$ of said first resistor satisfy the following relation:

$$\omega_L < \frac{1}{R_0(C_0 + C_{gs})} < \omega_0 \quad \text{(A)}$$

in relation to the input capacitance $C_{gs}$ of said transistor, the angular frequency $\omega_0$ of a signal to be transmitted and the angular frequency $\omega_L$ of a low-frequency component to be suppressed.

9. The stabilizing circuit in accordance with claim 2, wherein
 the capacitance value $C_0$ of said first capacitor, the resistance value $R_0$ of said first resistor and the resistance value $R_1$ of said second resistor satisfy the following relations:

$$R_0^2 > \frac{1 + \omega_0^2 R_1^2 (C_{gs} + C_0)^2}{\omega_0^4 R_1^2 C_0^2 C_{gs}^2 + \omega_0^2 C_0^2} \quad \text{and}$$

$$R_0^2 < \frac{1 + \omega_L^2 (R_1^2 (C_{gs} + C_0))^2}{\omega_L^4 R_1^2 C_0^2 C_{gs}^2 + \omega_L^2 C_0^2}$$

in relation to the input capacitance $C_{gs}$ of said transistor, the angular frequency $\omega_0$ of a signal to be transmitted and the angular frequency $\omega_L$ of a low-frequency component to be suppressed.

10. The stabilizing circuit in accordance with claim 5, wherein
 the characteristic impedance $Z_a$ and the length $L_a$ of said transmission line and the capacitance value $C_1$ of said second capacitor satisfy the following relation:

$$L_a = \frac{\lambda_H}{2\pi} \tan^{-1} \frac{1}{C_1 \cdot \omega_H \cdot Z_a}$$

in relation to the angular frequency $\omega_H$ and the wave length $\lambda_H$ of a high-frequency component to be suppressed.

11. The stabilizing circuit in accordance with claim 7, wherein
 the characteristic impedance $Z_a$ and the length $L_a$ of said transmission line and the capacitance value $C_1$ of said second capacitor satisfy the following relation:

$$L_a = \frac{\lambda_H}{2\pi} \tan^{-1} \frac{1}{C_1 \cdot \omega_H \cdot Z_a}$$

in relation to the angular frequency $\omega_H$ and the wave length $\lambda_H$ of a high-frequency component to be suppressed.

12. An amplifier comprising:

a transistor;

a first capacitor being directly connected between an input node receiving an input signal and an input-side electrode of said transistor; and a first resistor being directly connected between said input node and a prescribed reference potential, wherein the values of said first capacitor and said first resistor are set so that said first resistor consumes power in a predetermined low-frequency domain thereby preventing said transistor from oscillation in the low-frequency domain.

13. The amplifier in accordance with claim 12, further comprising a second capacitor being connected between an output-side electrode of said transistor and said reference potential.

14. The amplifier in accordance with claim 12, further comprising an inductance and a second capacitor being connected in series between an output-side electrode of said transistor and said reference potential.

15. The amplifier in accordance with claim 14, wherein said inductance includes a line.

16. The amplifier in accordance with claim 12, wherein the capacitance value $C_0$ of said first capacitor and the resistance value $R_0$ of said first resistor satisfy the following relation:

$$\omega_L < \frac{1}{R_0(C_0 + C_{gs})} < \omega_0$$

in relation to the input capacitance $C_{gs}$ of said transistor, the angular frequency $\omega_0$ of a signal to be transmitted and the angular frequency $\omega_L$ of a low-frequency component to be suppressed.

17. The amplifier in accordance with claim 13, wherein the capacitance value $C_0$ of said first capacitor, the resistance value $R_0$ of said first resistor and the resistance value $R_1$ of a second resistor satisfy the following relations:

$$R_0^2 > \frac{1 + \omega_0^2 R_1^2 (C_{gs} + C_0)^2}{\omega_0^4 R_1^2 C_0^2 C_{gs}^2 + \omega_0^2 C_0^2} \text{ and}$$

$$R_0^2 < \frac{1 + \omega_L^2 (R_1^2 (C_{gs} + C_0))^2}{\omega_L^4 R_1^2 C_0^2 C_{gs}^2 + \omega_L^2 C_0^2}$$

in relation to the input capacitance $C_{gs}$ of said transistor, the angular frequency $\omega_0$ of a signal to be transmitted and the angular frequency $\omega_L$ of a low-frequency component to be suppressed.

18. The amplifier in accordance with claim 12, further comprising a second resistor being connected between said input-side electrode of said transistor and said reference potential, wherein the values of said first capacitor, said first resistor and said second resistor are set so that said second resistor consumes power in a predetermined high-frequency domain thereby preventing said transistor from oscillation in the high-frequency domain.

19. The amplifier in accordance with claim 15, wherein the characteristic impedance $Z_a$ and the length $L_a$ of said transmission line and the capacitance value $C_1$ of said second capacitor satisfy the following relation:

$$L_a = \frac{\lambda_H}{2\pi} \tan^{-1} \frac{1}{C_1 \cdot \omega_H \cdot Z_a}$$

in relation to the angular frequency $\omega_H$ and the wave length $\lambda_H$ of a high-frequency component to be suppressed.

20. The amplifier in accordance with claim 12, wherein said transistor is a field-effect transistor.

21. An amplifier comprising:

first and second transistors;

a first capacitor being connected between a first input node receiving an input signal and an input-side electrode of said first transistor;

a first resistor being connected between said first input node and a prescribed reference potential;

a second capacitor being connected between a second input node receiving an input signal and an input-side electrode of said second transistor;

a second resistor being connected between said second input node and said reference potential;

a third capacitor being connected between an output-side electrode of said first transistor and said reference potential; and a transmission line and a fourth capacitor being connected in series between an output-side electrode of said second transistor and said reference potential, one of said first and second transistors being provided on a front stage, the other one of said first and second transistors being provided on a rear stage.

22. The stabilizing circuit in accordance with claim 1, further comprising a second capacitor being directly connected between an output-side electrode of said transistor and said reference potential.

23. The stabilizing circuit in accordance with claim 1, further comprising an inductance and a second capacitor being directly connected in series between an output-side electrode of said transistor and said reference potential.

24. The stabilizing circuit in accordance with claim 2, further comprising an inductance and a second capacitor being directly connected in series between an output-side electrode of said transistor and said reference potential.

25. The amplifier in accordance with claim 12, further comprising a second capacitor being directly connected between an output-side electrode of said transistor and said reference potential.

26. The amplifier in accordance with claim 12, further comprising an inductance and a second capacitor being directly connected in series between an output-side electrode of said transistor and said reference potential.

* * * * *